United States Patent [19]

Anagnostopoulos

[11] 4,079,422

[45] Mar. 14, 1978

[54] CHARGE INJECTION DEVICE READOUT

[75] Inventor: Constantine Nicholas Anagnostopoulos, Rochester, N.Y.

[73] Assignee: Eastman Kodak Company, Rochester, N.Y.

[21] Appl. No.: 731,077

[22] Filed: Oct. 12, 1976

[51] Int. Cl.² ............................................. H04N 5/30
[52] U.S. Cl. ................................ 358/213; 250/211 R; 250/578
[58] Field of Search .................... 358/213; 250/211 R, 250/211 J, 578; 315/169 TV; 340/173 LS; 317/235 N; 357/30

[56] References Cited

U.S. PATENT DOCUMENTS 3,786,263  1/1974  Michon ............................ 358/213 X

*Primary Examiner*—Robert L. Richardson
*Attorney, Agent, or Firm*—Robert F. Cody

[57] ABSTRACT

A readout technique for use with a charge injection device avoids intensity-distortion resulting from both over-illumination and pattern noise. Although the invention utilizes column- (or row-) capacitance changing to produce information signals, it provides readout by supplying charge from a reference source (capacitor) to the pixel being read, thereby restoring the column potential of the pixel to a reference level. The readout signal corresponds to the voltage change across the reference capacitor as a result of its discharge.

5 Claims, 13 Drawing Figures

CHARGE INJECTION DEVICE READOUT

BACKGROUND OF THE INVENTION

1. Field of the Invention

This invention relates in general to charge injection imaging devices (see U.S. Pat. No. 3,786,263) and more particularly to apparatus for reading out the information stored by such a device.

2. Description Relative to the Prior Art

Current thinking with respect to the readout of a charge injection device (CID) is to employ any of a number of techniques for sensing capacitance changes of the charge-collecting image sites or pixels. Techniques for sensing such capacitance changes have appeared in the literature, although on such technique is described below for purposes of facilitating understanding of the invention.

Two problems are associated with capacitance readout techniques: (1) capacitance differences from pixel to pixel, which may result from any of a number of structural sources within a CID, manifest themselves as pattern noise in the device output and (2) under certain illumination conditions, the visual image corresponding to the output of the CID is distorted intensity-wise. Although the first of the above-noted problems is relatively easy to appreciate, why the second problem should occur is another matter: An analysis is presented below to explain the source of the second problem.

Published Prior Art

1. Proceedings of 1975 International Conference on the Application of CCD's, Oct. 29 - 31 (San Diego, California) pages 351-260.
2. U.S. Pat. No. 3,949,245

SUMMARY OF THE INVENTION

The present invention provides a quasi-capacitive readout technique for use in combination with a CID imager, and which technique nullifies the second of the above-noted problems and, in so doing, contemporaneously obviates the first, or pattern noise, problem as well. In essence, the invention—while utilizing the capacitance change occurring at a pixel site as a measure of light received at such site—works to restore a quiescent capacitance (and voltage) level at such site, utilizing the discharge of a reference capacitor for such purpose. Thus the voltage change across the reference capacitor (which results from its discharge) is representative of the light received at the pixel site.

The invention will be described with reference to the figures within.

Figure 1:
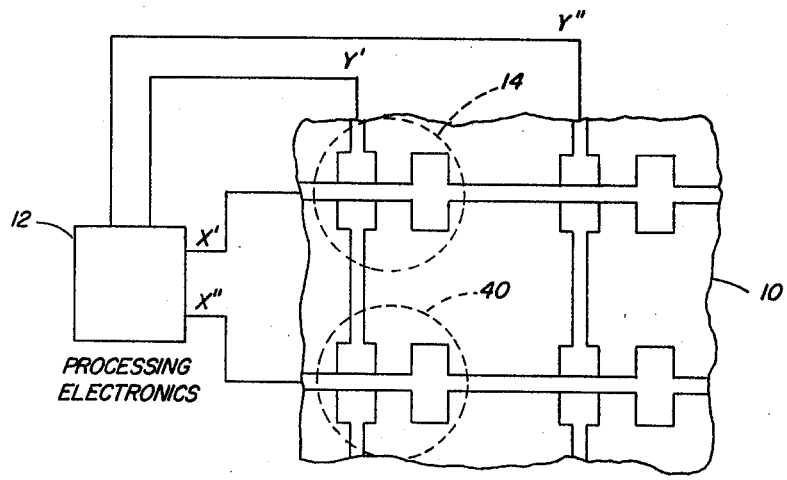
FIG. 1 is a plan view of a part of a basic CID structure.

Reference should be had to FIG. 1 which shows four pixels of a conventional CID 10: Each pixel, as is known, comprises a row-addressable MOS capacitor and a column-addressable MOS capacitor. By applying suitable address signals from processing electronics 12 to, for example, X' and Y' busses, a pixel 14 of the CID may be interrogated to produce a readout signal corresponding to the light information received at such pixel. (In the addressing scheme of FIG. 1, it will be noted that the row bus is addressed; then the column bus is addressed—readout being "column readout" as evidenced by the double-headed arrows which connect the processing electronics 12 and the column busses).

Figure 2A:
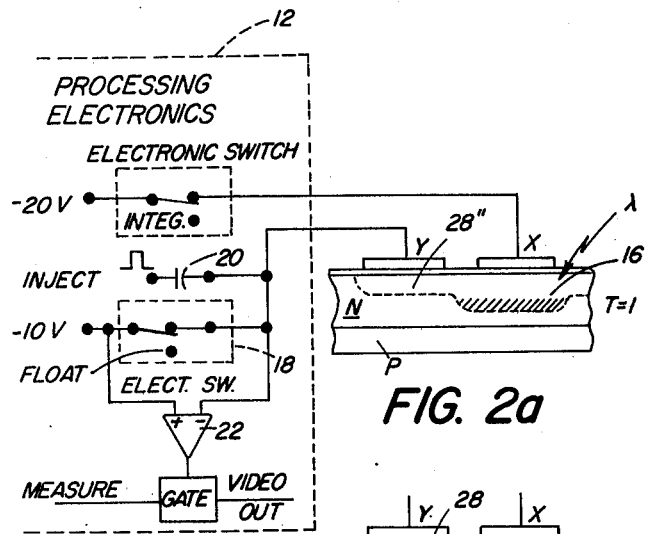
FIGS. 2a through 2d are illustrations useful in describing a typical prior art readout technique over which the invention is an improvement.
Figure 2B:
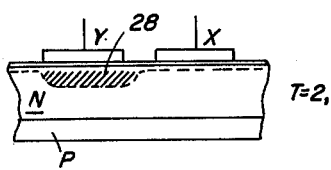
Figure 2C:
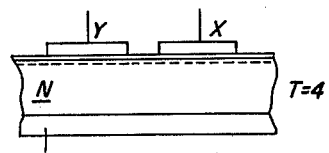
Figure 2D:
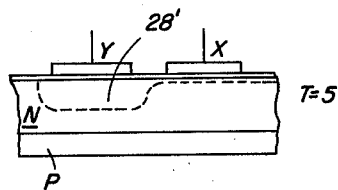
Figure 3:
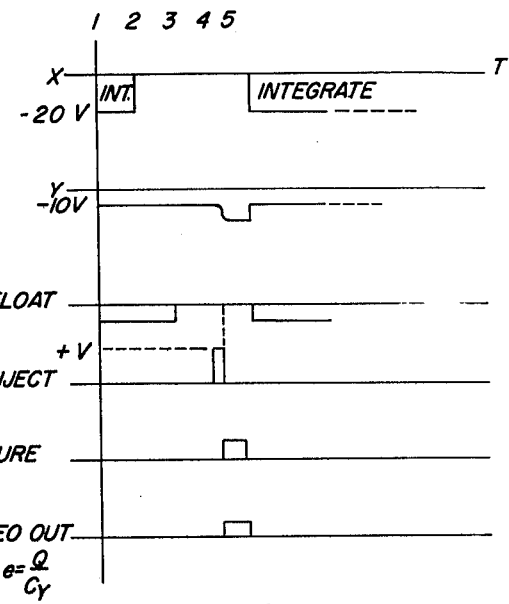
FIG. 3 illustrates the timing associated with the readout technique of FIG. 2.

To appreciate the workings of a typical pixel readout technique which is based on capacitance-change sensing, reference should be had to FIGS. 2a through 2d and the accompanying timing diagram of FIG. 3: Up to time $T=1$, light $\lambda$ causes a corresponding number of mobile minority carriers (holes) 16 to form in the body of the N-type semiconductor. Since the row gate X is at $-20V$, as shown, the minority carriers flow into the depletion region under the gate X. At time $T=2$, under control of the processing electronics 12, the row gate X potential goes to zero volts, causing the minority carriers 16 to shift to the depletion region under the Y gate, which is held at $-10V$ by the processing electronics.

At time $T=3$, an electronic switch 18 within the processing electronics is opened, causing the potential of the Y gate to float. (To be noted is that the Y gate potential does not change at time $T=3$, this being because the Y gate, and the depletion region thereunder, constitute, in actuality, no more than a charged capacitor which has been charged, and then removed from its charging source).

At time $T=4$ (and with the float switch 18 still open), a positive-going pulse is applied, via a coupling capacitor 20 within the processing electronics, to the Y gate. This causes the stored minority carriers to be injected into the semiconductor and gathered by the P-type epitaxial layer. Then at time $T=5$ (and with the float switch 18 still open), the potential of the Y gate is compared with the pre-injection potential ($-10V$) by a difference circuit 22, the comparison resulting in a video signal voltage representative of light $\lambda$ received at the pixel.

The mechanism for the production of the video signal voltage may be appreciated from FIGS. 2b and 2d: In FIG. 2b, a relatively large capacitance, corresponding to the close proximity of the depletion level 28 to the Y gate, is charged to $-10V$. Since, as indicated in FIG. 2d, the Y gate is still floating after the charge 16 has been injected, Y gate electrons are trapped on the Y gate. Such being the case, fixed (immobile) holes appear in the semiconductor material, thereby to neutralize the electronic charge on the Y gate. The immobile holes so produced characterize a depletion region 28' which, to be noted, is not only greater in depth than the depletion level 28, but is also greater in depth than the original Y depletion region (28", FIG. 2a). The relatively small capacitance that corresponds to the depth of the FIG. 2d depletion region 28' exhibits a larger voltage than that which corresponds to the capacitance associated with FIG. 2b, "signal voltage" being variable inversely with capacitance when the charge level is fixed (because of the action of the float switch 18). Thus, the FIGS. 2b-to-2d capacitance change translates directly into a signal voltage change.

Figure 4A:
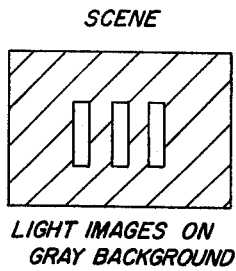
FIGS. 4a and 4b are drawings useful in illustrating the nature of a problem inherent in CID readout techniques similar to that of FIG. 2.
Figure 4B:
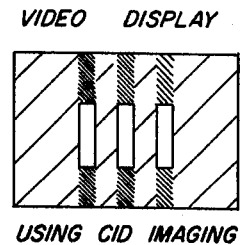

Assuming one were to use a CID capacitance readout scheme as disclosed in connection with FIGS. 2a through 2d, faithful reproduction of a scene as depicted in FIG. 4a would occur so long as the light images falling on the imaging face of the CID were not too bright. Were the light images to be brighter than a threshold level, the CID, per FIGS. 2a through 2d, would be productive of an intensity-distorted display as depicted in FIG. 4b. (The intensity-distortion problem has heretofore been sidestepped, principally—it is believed—because it was not fully appreciated). While one solution to such intensity-distortion is to employ a filter, or the like, over the imaging face of the CID, thereby reducing the light level reaching the CID face, such a technique leaves much to be desired since it sacrifices the sensitivity of the CID to assure against exceeding the above-noted brightness threshold. By analysis, the present invention identifies the cause of the intensity-distortion problem and provides apparatus which—while still basically employing capacitive readout—nullifies the influence of such problem cause:

PROBLEM

FIGS. 5a through 5d depict 2 pixels, say 14 and 40 of FIG. 1, wherein the pixel 14 shall be assumed to be addressed, for example, as indicated in connection with FIGS. 2a through 2d and FIG. 3. Assume further that the pixel 40 has been over-illuminated (time $T=1$), the depletion region under its $X''$ gate so overfilling with minority carriers that some of such minority carriers reside beneath the $Y'$ gate of the pixel 40. At time $T=2$ (FIG. 5b) the voltage on the $X'$ bus associated with the addressed pixel 14 is changed from $-20V$ to zero volts, causing the minority carriers of the pixel 14 to shift to beneath the $Y'$ gate thereof. (Since the potential on the $X''$ gate of the pixel 40 remains at $-20V$ at time $T=2$, the storage of its minority carriers does not change from that depicted in FIG. 5a). At time $T=3$, the potential of the $Y'$ gate of the pixel 14 is floated.

Figure 5A:
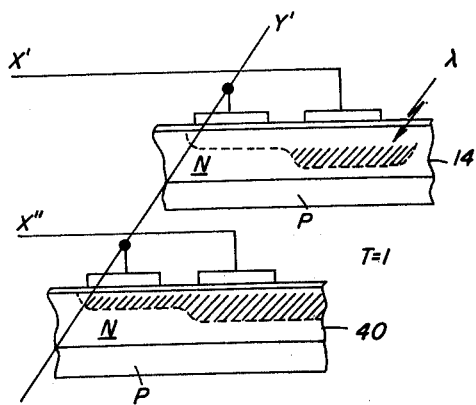
FIGS. 5a through 5d are drawings which serve to illustrate the cause of the problem inherent in prior art readout techniques.
Figure 5B:
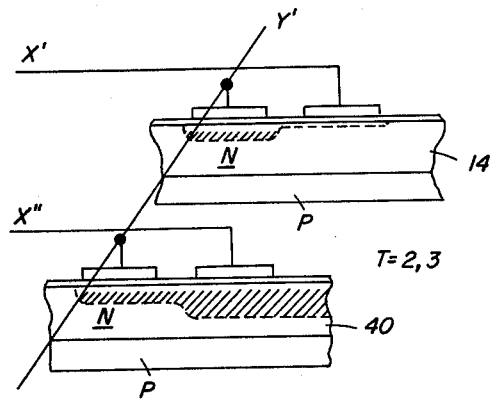
Figure 5C:
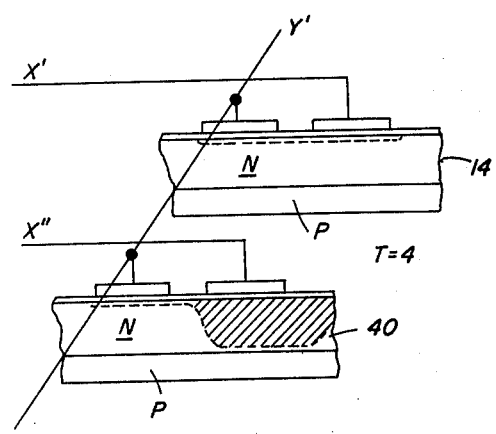
Figure 5D:
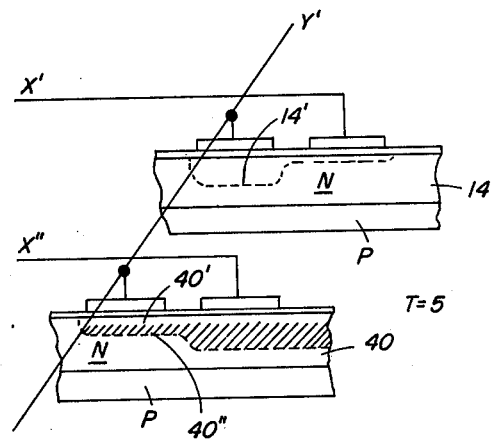

In response to a positive "injection" pulse (time $T=4$) the minority carriers beneath the $Y'$ gate of the pixel 14 are injected (FIG. 5c), the minority carriers of the pixel 40 shifting to reside, at least moreso, under the $X''$ gate thereof. After the "injection" pulse (time $T=5$), the situation depicted in FIG. 5d obtains. As was the case in connection with FIG. 2d, the $Y'$ gate capacitance of the pixel 14 at this time has decreased as a result of the charge-injection—but such charge-injection has had no effect on the storage of minority carriers beneath the $Y'$ gate of the over-illuminated pixel 40. Since the capacitance change which is measured per the above-described technique is, in actuality, the capacitance change occurring in a "column" of capacitors connected in parallel, i.e., the "$Y'$ capacitor" of the pixel 14 is in parallel with the "$Y'$ capacitor" of the pixel 40, the $Y'$ column capacitance of FIG. 5d is greater than when the pixel 40 is not over-illuminated. In other words, in FIG. 5d, the capacitance corresponding to the depletion level 40', when summed with the capacitance corresponding to the depletion level 14' produces a greater column capacitance than when the capacitance corresponding to the depletion level 40'' is summed with the capacitance corresponding to the depletion level 14'. Because such column capacitance is greater than it ought to be in this instance, all pixels associated with the $Y'$ column which are not over-illuminated, will, when addressed, produce a readout voltage which is lower than what would be representative of the light falling thereon. Attendantly, the display of FIG. 4b results.

Having identified the source of the intensity-distortion problem, a new problem obtains, viz. how to provide capacitive-based readout without having to read column capacitance.

SOLUTION

The invention—while utilizing the mechanism of pixel capacitance-changing within a CID for purposes of determining the level of light received—does not directly convert, say, a column capacitance to a signal voltage. Rather, the invention teaches, in the readout of a CID pixel, the supply of charge to the pixel being read, such charge restoring the capacitance and voltage of the pixel readout gate (and of the column, since all pixels in the column are connected in parallel) to its pre-light-integration level. The supply of charge is from a pre-charged capacitor, the voltage change thereof resulting from its discharge being a video signal that is totally independent of column capacitance; and attendantly a display therefrom will not be intensity-distorted as a result of the over-illumination of column pixels.

Figure 6:
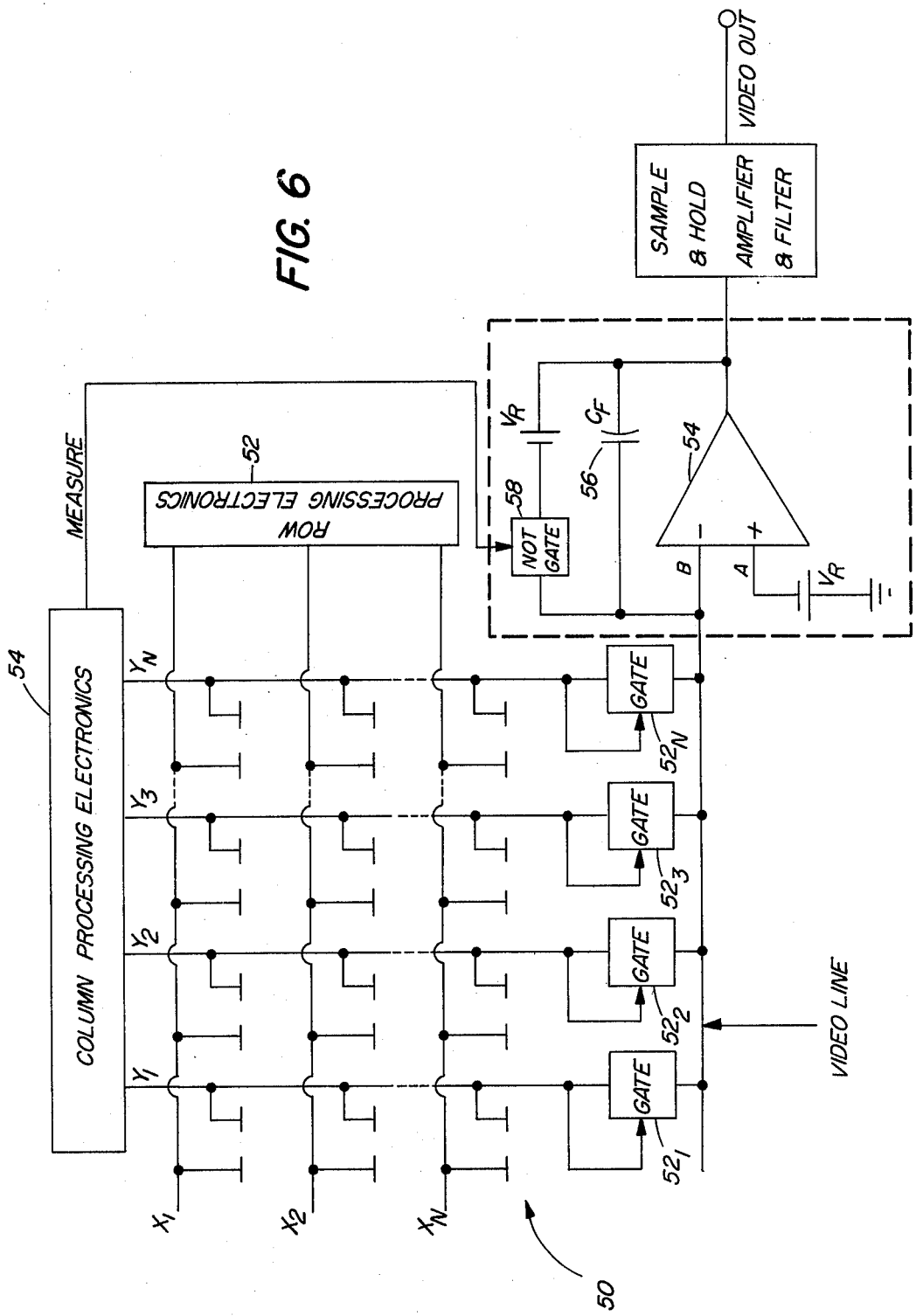
FIG. 6 is a schematic diagram illustrating a presently preferred embodiment of the invention.

Reference should now be had to FIG. 6: A schematically depicted CID 50 is row-and-column addressable by processing electronics 52 and 54 as per the discussion relating to FIGS. 2a through 2d. Gates 52—which may be on-chip MOS switches—are respectively connected to each column bus and are adapted to open when their respective columns are addressed, thereby effectively insulating the columns from each other. (Gate-operation is, for example, designed to occur while "measuring", which is a set-time after occurrence of the "injection" pulse). The output circuits of the gates 52 are connected to one input A of an operational amplifier 54 having a reference voltage $V_R$ applied to its other input B. The reference voltage $V_R$ equals the column potential $-10$ volts) discussed above in connection with FIG. 2. A feedback capacitor 56 is connected between the output and input B of the amplifier 54; and such capacitor is periodically charged to the reference voltage $V_R$ through a gate 58. That is, the gate 58 periodically removes the reference voltage source from across the feedback capacitor 56 under action of a signal ("measure", time $T=5$ per FIG. 2d) calling for a pixel to be read.

In reading the minority charge accumulation, say, of the pixel $X_1Y_1$ (FIG. 6), the gate 58 allows the capacitor 56 to charge (between times $T=0$ and $T=5$) to the reference voltage $V_R$. Up to time $T=5$, the amplifier 54 has virtually no output since its A and B inputs are identical. At time $T=5$, however, the gate 58 is inhibited; and the gate $52_1$ opened. Assuming the $Y_1$ potential has, as a result of minority carrier injection, gone from $-10V$ to $-12V$, the amplifier output goes positive by 2 volts, thereby causing charge (electrons) to be drawn from the $Y_1$ gate and resulting in its potential returning to $-10V$. Since the capacitor 56 works to restore the column voltage—and which voltage is not affected as a result of over-illumination of other column pixels—it develops an information representative voltage-change corresponding to its charge-change, the value of the capacitor 56 being a constant.

The invention has been described in detail with particular respect to implementations thereof, but it will be appreciated that variations and modifications can be effected within the spirit and scope of the invention. For example, while the CID of FIG. 6 is operated according to the readout scheme of FIGS. 2a through 2d, other CID readout schemes which are based on "column" (or "row") capacitance change are practicable with the invention. See, for instance, the readout schemes appearing on page 35 of *ELECTRO-OPTICAL SYSTEMS DESIGN*, Oct., 1975.

What is claimed is:

1. In combination,
   (a) a charge injection device having a plurality of MOS pixels, each pixel being comprised of first and second gate electrodes, said first gate electrodes being electrically isolated from each other and said second gate electrodes being electrically connected together,
   (b) means for applying first and second voltages respectively to the electrically isolated and electrically connected gate electrodes, said first voltage providing a greater depletion region within the body of the semiconductor material forming said charge injection device than said second voltage, and
   (c) means for selectively determining the level of minority charges at a given pixel comprising
      (1) means for floating the voltage on the second gate electrode of the given pixel,
      (2) means operative while floating the voltage on the second gate electrode for varying the first voltage to decrease the depletion region beneath the first gate electrode of the given pixel, thereby to cause the minority charge thereunder to shift to beneath the second gate electrode of the given pixel, thereby further causing the capacitance between the second gate electrode and the semiconductor body of the charge injection device to change, and
      (3) prechargeable capacitive means, cooperative with said second gate electrode for supplying charge to said second gate electrode to keep the voltage thereon constant, the voltage change of said prechargeable capacitive means corresponding to said minority carriers beneath said second gate electrode.

2. The combination of claim 1 wherein said prechargeable means comprises:
   (a) a difference amplifier having first and second input circuits and an output circuit,
   (b) a capacitor connected between said output circuit and said first input circuit,
   (c) means for applying a bias equal to said second voltage to said second input circuit, and
   (d) means for charging said capacitor to said second voltage before selectively determining the minority charge level of a pixel.

3. In combination,
   (a) a charge injection device comprising
      (1) a plurality of pixels arranged in columns and rows, each pixel being comprised of a row and a column gate electrode,
      (2) row busses connecting the row gate electrodes of respective rows of pixels, and
      (3) column busses connecting the column gate electrodes of respective columns of pixels
   the column and row busses being electrically insulated from each other
   (b) means for selectively applying and removing depleting potentials to and from said row busses,
   (c) a potential source for applying to said column busses depletion potentials which are less than the depletion potentials applied to said row busses, and switch means for removing the potential source from said column busses,
   (d) difference means selectively cooperative with said column busses for comparing the potential of a selected column bus with a reference potential to produce an error voltage, and
   (e) a capacitor adapted to be precharged to said reference potential and selectively connectable to said column busses, said capacitor being connected to the output of said difference means and dischargeable in proportion to said error voltage,
   the potential charge across said capacitor corresponding to an information signal.

4. Circuit apparatus comprising:
   (a) a charge injection device pixel comprising first and second gate electrodes,
   (b) means for applying first and second potentials to said electrodes, said first potential providing a greater depletion region within the body of the charge injection device pixel than said second potential,
   (c) means for floating the potential on the second gate electrode,
   (d) means operative while floating the potential on the second gate electrode for varying the first potential to decrease the depletion beneath the first gate electrode, and
   (e) means having a reference potential responsive to the potential of said second gate electrode for altering its reference potential to maintain the potential of said second gate electrode,
   the change in potential of said reference potential means being representative of the minority carrier charge stored by said pixel.

5. The apparatus of claim 4 wherein said means having a reference potential comprises:
   (a) a capacitor, adapted to be precharged to the second potential, and selectively connectable to said second gate electrode, and
   (b) means for comparing the potential of said second gate electrode with said reference potential to produce an error voltage, said error voltage being applied to said capacitor,
   whereby said capacitor in response to said error voltage charges and discharges to maintain the second potential of said second gate electrode, the potential change across said capacitor being representative of stored minority carrier charge.

* * * * *